US009236947B2

(12) United States Patent
Schunk

(10) Patent No.: US 9,236,947 B2
(45) Date of Patent: Jan. 12, 2016

(54) FAST THIN-FILM LIGHT EMITTING DIODE

(71) Applicant: Avago Technologies General IP (Singapore) Pte. Ltd., Singapore (SG)

(72) Inventor: Nikolaus W. Schunk, Maxhuette-Haidhof (DE)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 123 days.

(21) Appl. No.: 14/016,390

(22) Filed: Sep. 3, 2013

(65) Prior Publication Data
US 2015/0063829 A1 Mar. 5, 2015

(51) Int. Cl.
G02B 6/132 (2006.01)
H04B 10/50 (2013.01)
H01L 33/06 (2010.01)
H01L 33/14 (2010.01)

(52) U.S. Cl.
CPC .............. H04B 10/502 (2013.01); H01L 33/06 (2013.01); H01L 33/145 (2013.01)

(58) Field of Classification Search
CPC ... H01L 33/14; H01L 33/0095; H01S 5/2231; H01S 5/2219
USPC ................................................. 398/201, 182
See application file for complete search history.

(56) References Cited

U.S. PATENT DOCUMENTS

| 4,329,625 A * | 5/1982 | Nishizawa .......... H01L 31/1126 257/257 |
| 6,252,894 B1 * | 6/2001 | Sasanuma et al. ......... 372/45.01 |
| 6,852,968 B1 * | 2/2005 | Ouchi .................... B82Y 20/00 250/201.3 |
| 2004/0264536 A1 * | 12/2004 | Ryou .................. H01S 5/18308 372/50.1 |
| 2011/0279054 A1 | 11/2011 | Katona et al. |
| 2012/0219250 A1 * | 8/2012 | Ren ........................ G02B 6/132 385/14 |
| 2013/0026447 A1 * | 1/2013 | Kloth et al. ..................... 257/13 |

FOREIGN PATENT DOCUMENTS

WO 2007027186 A1 3/2007

OTHER PUBLICATIONS

Kashima et al., "Performance of multiple quantum well edge-emitting LED", Proc. SPIE 2139, Quantum Well and Superlattice Physics V, 138, Conference vol. 2139, The International Society for Optical Engineering, May 11, 1994, 3 pages.

* cited by examiner

Primary Examiner — Oommen Jacob

(57) ABSTRACT

A thin-film Light Emitting Diode (LED) and methods of manufacturing the same are disclosed. Specifically, the thin-film LED is provided with an epitaxial layer having a proton implantation that controls the size of the active volume. Controlling the size of the active volume enables the thin-film LED to enjoy decreased rise and fall times, thereby achieving a thin-film LED that is useable for transmission in high transmission rate communication systems.

19 Claims, 7 Drawing Sheets

FAST THIN-FILM LIGHT EMITTING DIODE

FIELD OF THE DISCLOSURE

The present disclosure is generally directed toward Light Emitting Diodes (LEDs) and specifically directed toward thin-film LEDs.

BACKGROUND

Up to now, the only fast Light Emitting Diodes (LEDs) available are volume emitters. The output power of these volume-emitting LEDs is increased by a Bragg reflector at the rear side or at both sides (e.g., resonant cavity LED). Volume emitters are somewhat limited in that they will always have a larger form factor than their thin-film counterparts.

In the meantime, the progress at High Brightness LEDs (HB-LEDs) is enormously high. These HB-LEDs are designed for use in illumination, specifically in fields of use such as: light bulb replacement; automotive bulbs; and backlighting for flat screen televisions and projectors. All of these high output power LEDs are based on the thin-film manufacturing process. A significant disadvantage to using thin-film LEDs is that they are extremely slow in time behavior. The red thin-film LEDs (e.g., approximately 650 nm) are especially slow. Accordingly, the thin-film LEDs are severely limited in that they can only be used in plastic optical fiber data-rate transmission systems where transmission speeds are no more than 5-10 Mbit/s.

BRIEF DESCRIPTION OF THE DRAWINGS

The present disclosure is described in conjunction with the appended figures, which are not necessarily drawn to scale.

DETAILED DESCRIPTION

Figure 1:
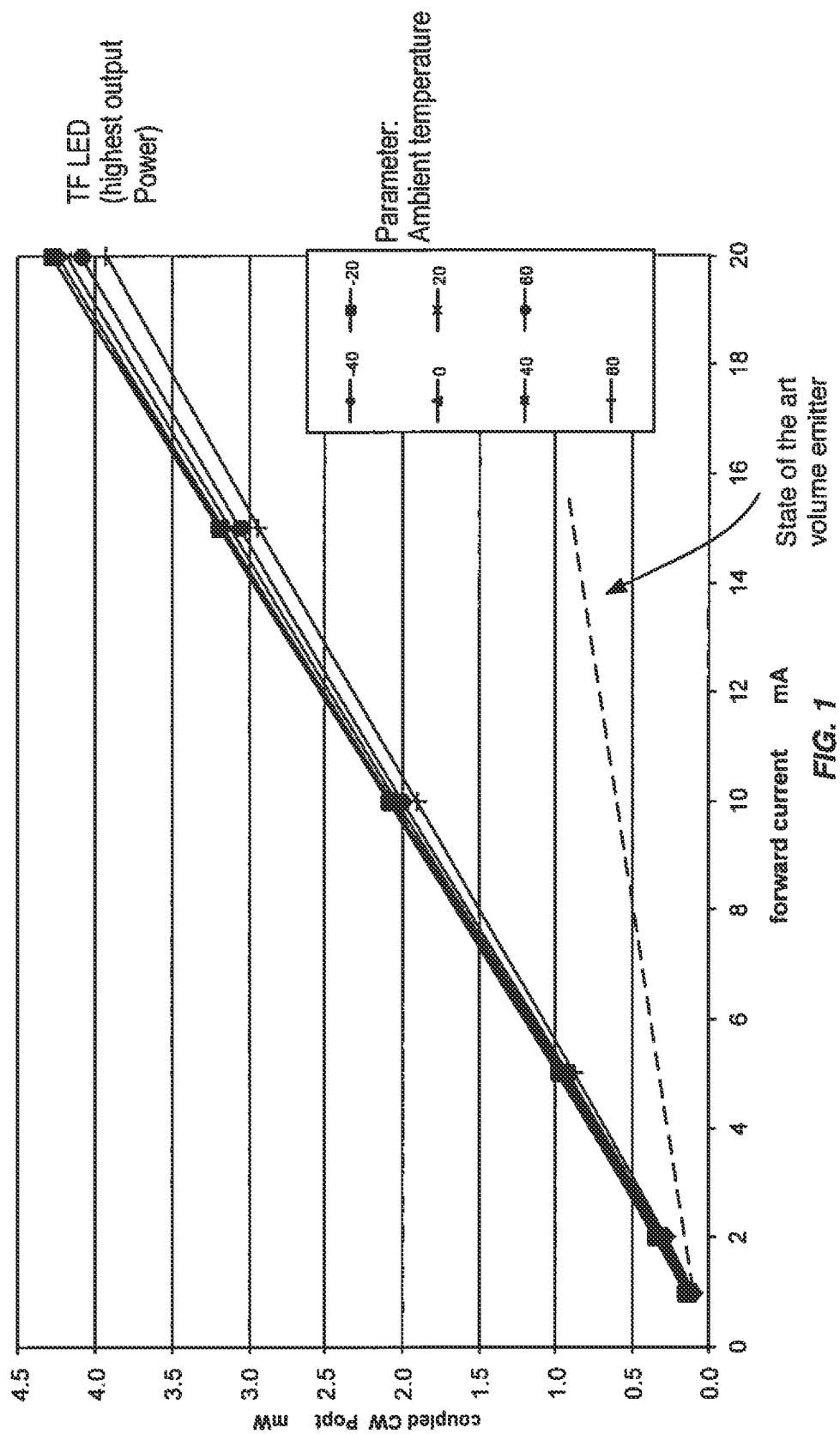
FIG. 1 is a chart depicting coupled power as a function of forward current for 650 nm thin-film LEDs with temperature as an adjusted parameter.

Various aspects of the present disclosure will be described herein with reference to drawings that are schematic illustrations of idealized configurations. As such, variations from the shapes of the illustrations as a result, for example, manufacturing techniques and/or tolerances, are to be expected. Thus, the various aspects of the present disclosure presented throughout this document should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present disclosure.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" or "established" on another element, it can be grown, deposited, etched, attached, connected, coupled, or otherwise prepared or fabricated on the other element or an intervening element.

Furthermore, relative terms, such as "lower" or "bottom" and "upper" or "top" may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower" can, therefore, encompass both an orientation of "lower" and "upper" depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Various aspects of a thin-film LED may be illustrated with reference to one or more example configurations. A thin-film LED is an LED that is deposited onto a substrate in thin material layers. Thin-film refers to a technology and is not restricted to any particular thickness for each layer.

Furthermore, various descriptive terms used herein, such as "transparent" should be given the broadest meaning possible within the context of the present disclosure. For example, something that is described as being "transparent" should be understood as having a property allowing no significant obstruction or absorption of electromagnetic radiation in the particular wavelength (or wavelengths) of interest, unless a particular transmittance is provided.

It is with respect to the above-noted shortcomings that embodiments of the present disclosure were envisioned. In particular, embodiments of the present disclosure contemplate combing red thin-film technologies with proton implantation technologies to yield extremely fast data communication LEDs (e.g., red LEDs) with a very high output power level. The data transmission speed and output power level can be optimized by selectively adjusting the diameter of the active volume of the LED. Considering the number of the Quantum Wells (QW) in the active volume of the LED, the optimization can be expended to the temperature dependency of the output power. With a higher number of the QWs, the temperature degradation gets smaller, but the speed gets slower.

It should be appreciated that while certain examples discussed herein will be related to a particular type of LED (e.g., red LEDs), the increase in the speed of the LEDs by proton implantation is not restricted to red LEDs. Instead, it should be appreciated that any type of thin-film LED (e.g., blue, green, infrared, etc.) can benefit from the proton implantation mechanisms described herein.

Due to the fact that the optical output power of such thin-film LEDs is much higher in comparison to the volume emitters, new thin-film LED-based data communication transmitters can be realized with a much lower current consumption. Accordingly, the wall plug efficiency (e.g., ratio of optical output power to electrical input power) is drastically improved, yielding much lower electrical energy consumption in relation to current state-of-the-art plastic optical fiber transmitter products.

FIG. 1 depicts the coupled power versus the LED current with temperature as a parameter. A state-of-the-art fast volume-emitting LED is also shown. As can be seen in FIG. 1, more than 1 mW coupled CW power into a standard 1 mm plastic optical fiber is possible for low current levels using a traditional red thin-film LED. It can also be seen that the slope of the P-I curve is nearly independent of the temperature.

Figure 2:
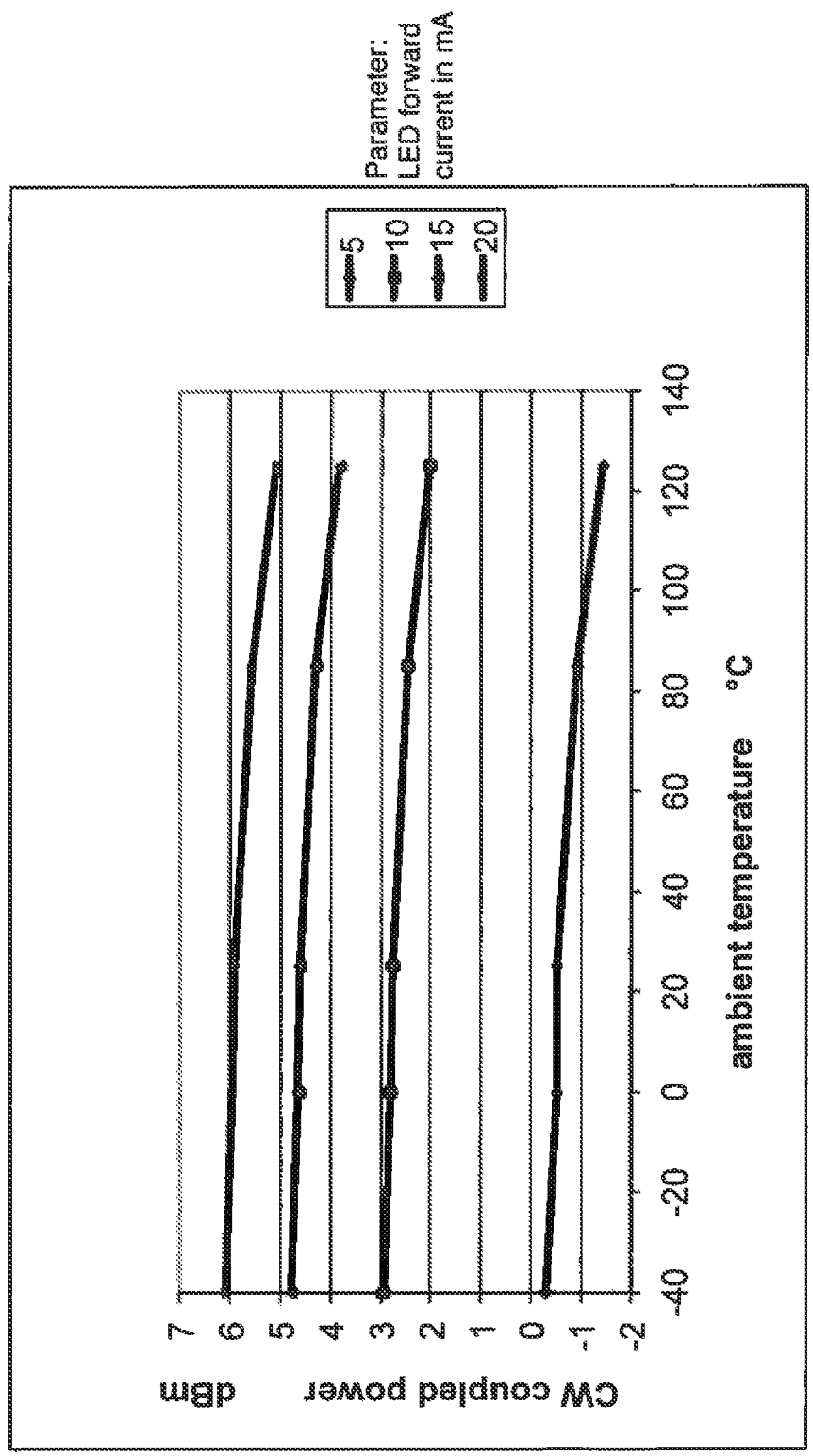
FIG. 2 is a chart depicting a 650 nm thin-film LEDs stability of coupled power in dBm over a temperature range from −40° C. up to 125° C.

The stability of the coupled power over a temperature range from −40° C. up to 125° C. is given in FIG. 2. Here a multicore glass fiber has been used, as the plastic optical fiber is limited in the temperature range up to 110° C. Only 1 dB output power degradation is measured for the red thin-film LED.

Figure 3:
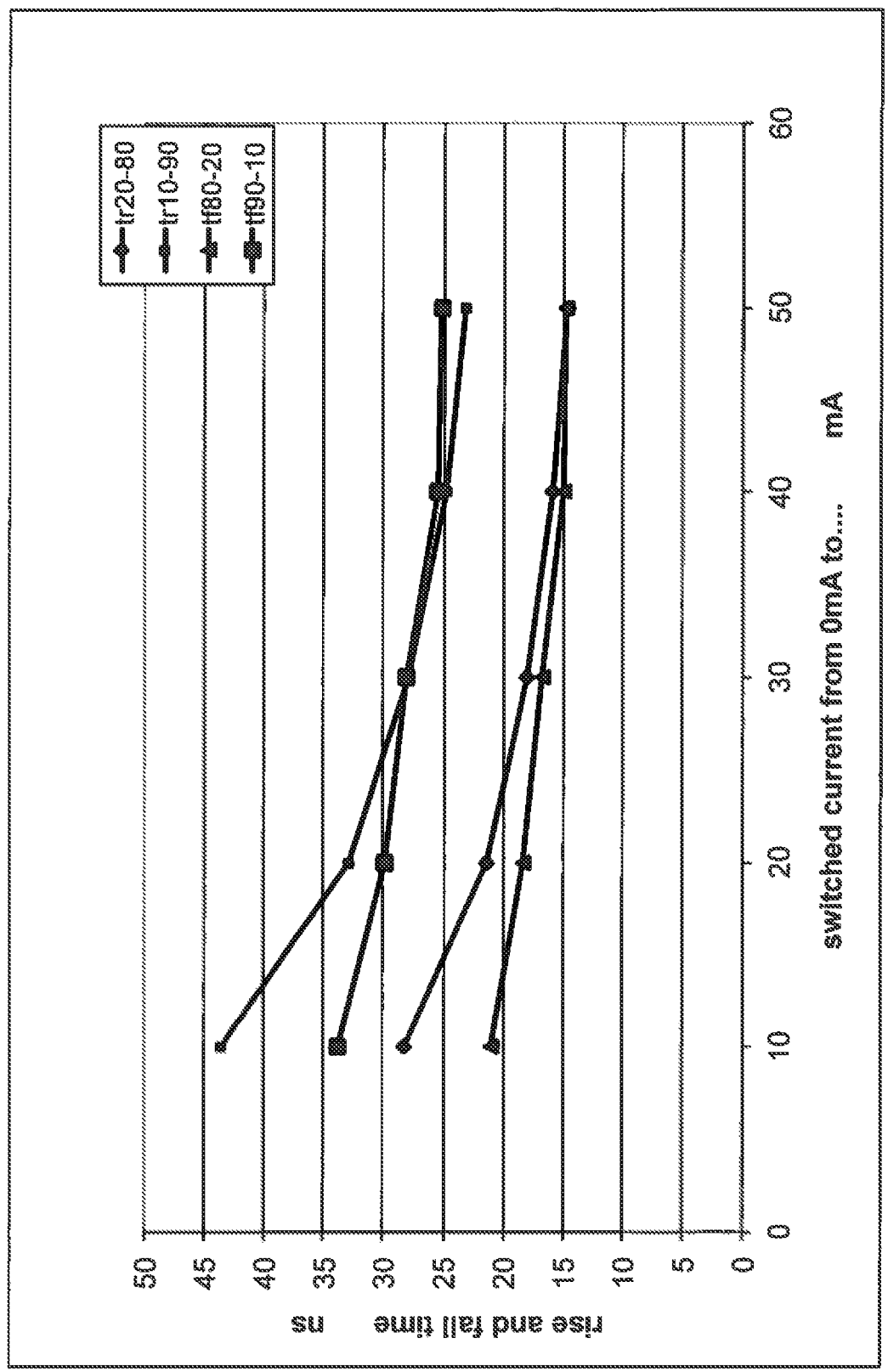
FIG. 3 is a chart depicting a thin-film LEDs rise and fall time in nanoseconds as a function of switched current in milliamps.

While traditional thin-film LEDs exhibit fantastic power efficiencies and operating temperatures, traditional thin-film LEDs have a relatively high rise and fall time as compared to their volume emitter counterparts. This phenomenon is depicted in FIG. 3, where it is shown that the 20% to 80% rise time is 28 ns when switching the current from 0 to 10 mA and down to 15 ns by switching up to 50 mA. Therefore, such a traditional thin-film LED might be used as source in plastic optical fiber data communication transmission systems as long as the transmission rates are no larger than 10 Mbit/s.

As is known in the LED arts, the rate equation of the carrier density of an LED is as follows:

$$\frac{dn}{dt} = \frac{I}{eV} - \frac{n}{\tau_{sp}}$$

and $$\tau_{sp} = 1/(B \cdot \bar{n})$$

where I is the pump current, I/(eV) is the pumpterm, $$\frac{n}{\tau_{sp}}$$

is the spontaneous recombination, B is the radiative recombination coefficient, and $\bar{n}$ is the Quasi stationary carrier density.

As can be appreciated from the above, some ways to speed up an LED (e.g., increase the $$\frac{dn}{dt})$$

include increasing the current, I, or decreasing the volume/area of the LED's active zone.

Figure 4:
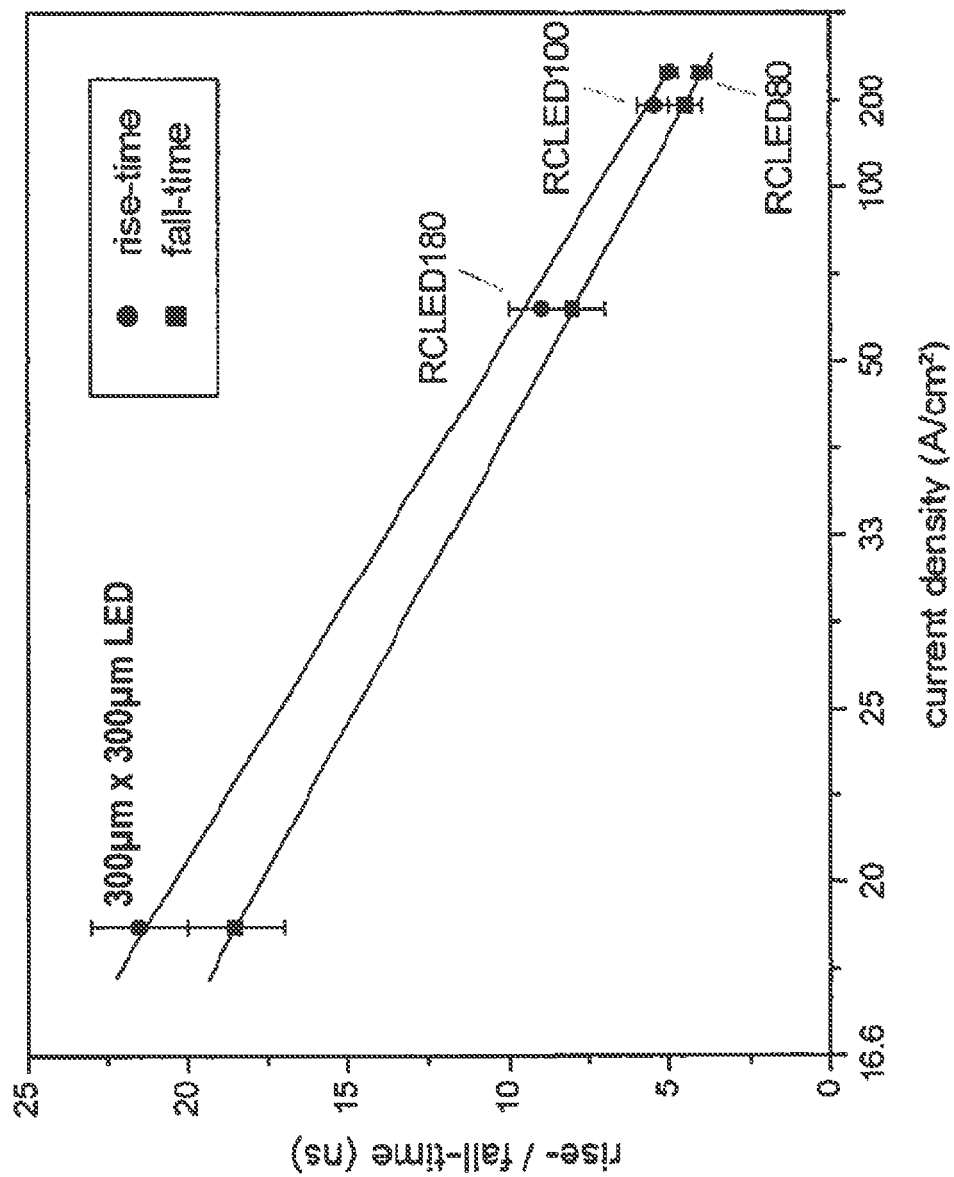
FIG. 4 is a chart depicting the impact of the decreased emitting area on the rise and fall time along with a 300 μm×300 μm LED volume emitter's rise and fall time.

The impact of the decreased area on the rise and fall time is shown in FIG. 4. For a comparison, the rise and fall time for a 300 μm×300 μm LED (volume emitter) is also given. By decreasing the active volume/area of the LED, the rise and fall time is decreased from 20 ns down to roughly 5 ns for an LED having an active area diameter of approximately 80 μm.

It is, therefore, one aspect of the present disclosure to utilize this technology for a thin-film LED wafer. By reducing the active area of a thin-film LED, the overall rise and fall time of the thin-film LED can also be reduced. More specifically, the lowest switching time constants will be obtained for thin-film LED wafers with approximately 2 to 5 Quantum Wells in the active zone.

In particular, it is an aspect of the present disclosure to provide a thin-film LED wafer that is capable of operating in Gigabit data transmission systems.

Figure 5A:
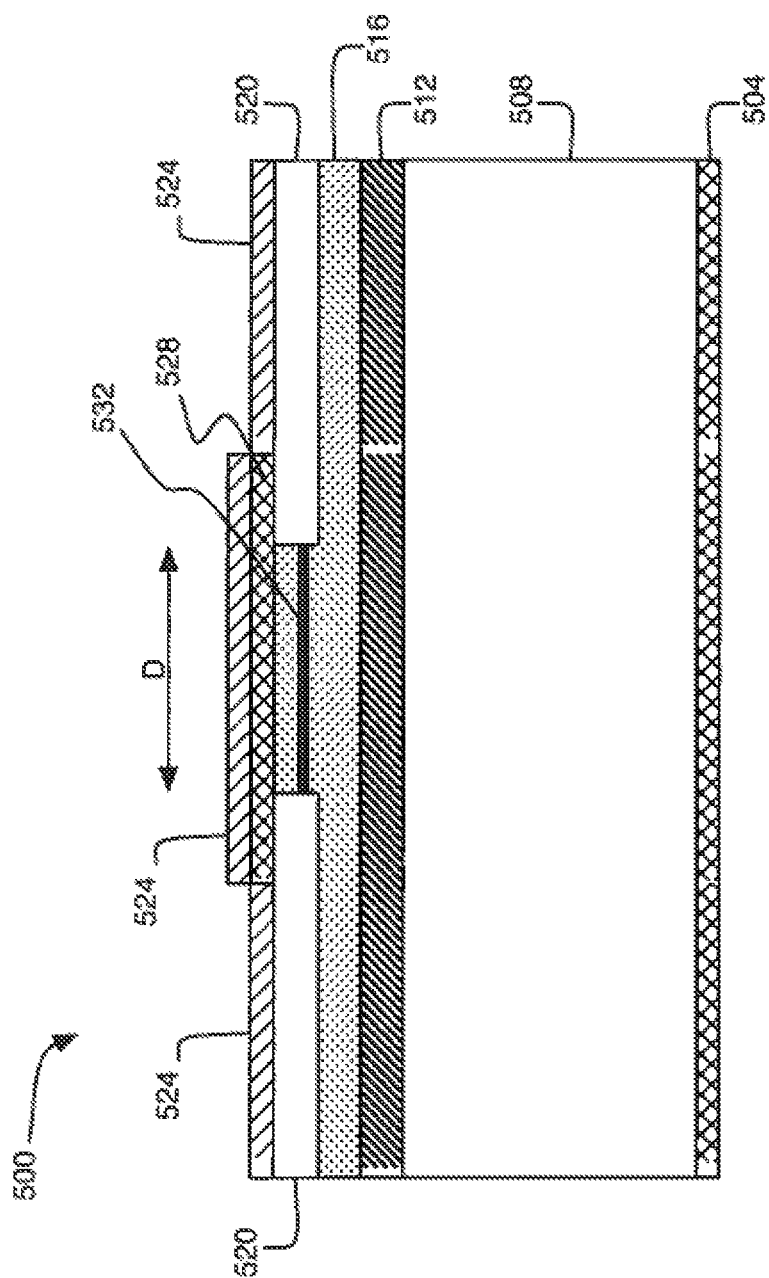
FIG. 5A is a cross-sectional view showing a first thin-film LED structure in accordance with embodiments of the present disclosure.

FIG. 5A depicts a first thin-film LED structure 500 in accordance with embodiments of the present disclosure. The LED structure 500 is shown to include a bottom contact 504, a substrate 508, a mirror layer 512, the whole epitaxial layer 516 (e.g., the epitaxial layer 516 may include a heterostructure and cladding layer outside of an active layer or volume 532), proton implantation 520, a passivation layer 524, and a top contact 528. It should be appreciated that some or all of the layers or components of the LED structure 500 may be deposited using any type of known deposition technique. Examples of such techniques include, without limitation, Chemical Vapor Deposition (CVD) processes (e.g., metal organic chemical vapor deposition), Atomic Layer Deposition (ALD), plasma-enhanced ALD, and/or photo-enhanced CVD.

In some embodiments, the bottom contact 504 may correspond to a sintered material and may correspond to an anode of the LED structure 500. The bottom contact 504 can be constructed of any electrically-conductive material. Examples of suitable materials that can be used for the bottom contact 504 include, without limitation, gold, titanium, nickel, platinum, palladium, chromium, and combinations thereof. In some embodiments, the bottom contact 504 may correspond to an n- or p-metal contact constructed of a high-conductivity metal.

The substrate 508 may correspond to any type of material suitable to physically and/or mechanically support the other layers of the structure 500. In some embodiments, the substrate 508 is sapphire, Silicon Carbide, Silicon, or the like. Other types of materials may also be used to construct the substrate 508 including, without limitation, GaAs or Ge, and combinations thereof.

The mirror layer 512 may correspond to any type of metal or reflective material that helps to direct light generated in the active volume 532 generally upward (e.g., toward the top contact 528). Examples of materials that may be used to construct the mirror layer 512 include, without limitation, gold, silver, alumina, etc.

The epitaxial layer 516 may include an active volume having a plurality of Quantum Wells (e.g., between 2 and 7) that enable the active volume 532 to emit photons in response to having current pass therethrough. Specifically, when an electrical potential is applied across the bottom contact 504 and top contact 528, electrons may pass through the active volume 532, thereby causing the active volume 532 to emit photons as a result. As a non-limiting example, the active volume 532 may be constructed of Aluminum-Indium-Gallium-Phosphide (AlInGaP) or a functional equivalent.

Figure 5B:
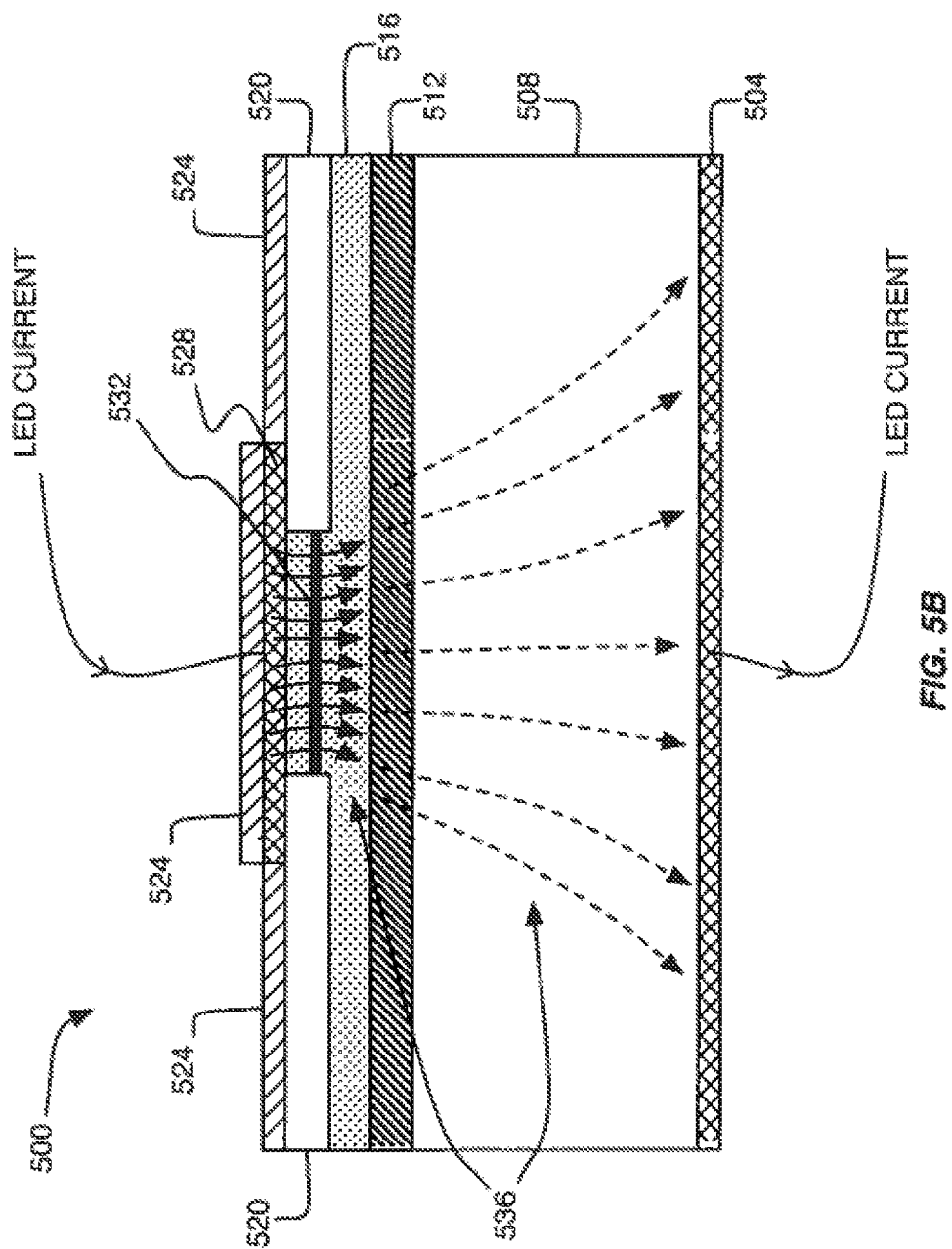
FIG. 5B is a cross-sectional view of the thin-film LED in FIG. 5a further showing current flow through the structure in accordance with embodiments of the present disclosure.

In accordance with at least some embodiments of the present disclosure, the proton implantation 520 is used to constrict or control a size of the active volume 532 within the total planar epitaxial layer 516. As can be seen in FIG. 5B, the proton implantation 520 may be used to destroy the crystal structure outside of the active volume 532, thereby forcing the forward current 536 to flow thru the active volume 532, yielding an increased carrier density in the active volume 532. In other words, the proton implantation 520 reduces the cross section of the active volume 532 and eliminates the electrical conductivity outside the active volume 532. Such a feature can be achieved without having to provide the proton implantation 520 completely through the total epitaxial layer 516. Rather, the thickness of the proton implantation 520 may be less than the thickness of the epitaxial layer 516 without departing from the scope of the present disclosure.

Accordingly, the active volume 532 corresponds to the remaining active area of the whole active volume of the LED structure 500. Positioning of the proton implantation 520 substantially acts as a mask to limit/control the active size of the active volume 532 to diameter D, thereby enabling the LED structure 500 to operate at substantially higher rates (e.g., reducing the overall rise and fall time of the thin-film LED structure 500). Thus, incorporating the proton implantation 520 enables the thin-film LED structure 500 to operate as a transmitter in plastic optical data communication systems where transmission rates may exceed 1 Gigabit/sec. According to embodiments of the present disclosure, the thin-film LED structure 500 can be designed for specific bitrate ranges (e.g., anywhere between 10 Mbit/sec and 10 Gigabit/sec) by adjusting the number of Quantum Wells in the active volume 532 as well as controlling the diameter D of the active volume 532. An illustrative diameter D of the active volume 532 may vary anywhere from 60 um up to 180 um and the specific diameter D of any particular thin-film LED structure 500 can vary depending upon the transmission rate in the optical transmission system, which has to be fulfilled by the LED transmitter.

In some embodiments, the thin-film LED structure 500 is generally configured to emit light from the active volume 532 toward the passivation layer 524 and top contact 528. Thus, the depicted thin-film LED structure 500 is configured as a top-emitting LED structure. Furthermore, while embodiments of the present disclosure have discussed using a proton implantation 520 to constrict the active volume 532 to have a diameter D, it should be appreciated that the proton implantation 520 does not necessarily have to constrict the active volume 532 to a circular shape. Instead, the active volume 532, when viewed from above, may have a square, rectangular, elliptical, polygonal, triangular, or any other type of shape without departing from the scope of the present disclosure. The discussion of a circular active volume 532 is for illustrative purposes only and should not be construed as limiting in any way.

Completing the discussion of the structure 500, the passivation layer 524 and top electrode 528 are formed on top of the epitaxial layer 516 and proton implantations 520. The top electrode 528 may correspond to a cathode of the structure 500 and may include similar or identical materials used for the bottom electrode 504. The layout, in some embodiments, is an open metal ring with conductive lines inside for an uniform current density in the active zone 532. The passivation layer 524 may be constructed using any type of deposition technique known in the art. As some non-limiting examples, the passivation layer 524 may correspond to a quarter wavelength (or odd multiple) $Si_xN_y$ layer formed on exposed surfaces of the top contact 528. The establishment of the passivation layer 524 may be done in order to reduce the reflection at the LED-air interface (e.g., refractive index step) and secondly shield the LED material from the environment (e.g., humidity, aggressive atmosphere, etc.). Alternatively, the passivation layer 524 could be formed by sputtering, electron beam evaporation, or by coating with a suitable protective material, such as epoxy or flowable $SiO_2$. As another example, spin-coating may prove to be a particularly useful coating technique. In FIG. 5A, it is shown that the top contact layer 528 comprises an area larger than the active volume 532 by less than the overall area of the total epitaxial 516. In other words, the top contact 528 is at least partially formed on the proton implantations 520 that establish the active volume 532, but the current flow is limited thru the active volume 532. One major difference between thin-film LEDs and volume emitters, is that thin-film LEDs produce substantially more power (e.g., the light produced by thin-film LEDs is more intense), as the metal layer reflectivity is very high. Accordingly, simple substitution of old low-power LEDs with the thin-film LEDs described herein may not be possible. Instead, one may be required to adapt the power output of the thin-film LED so as to avoid saturating the optical receiver in the data communication system.

Figure 6:
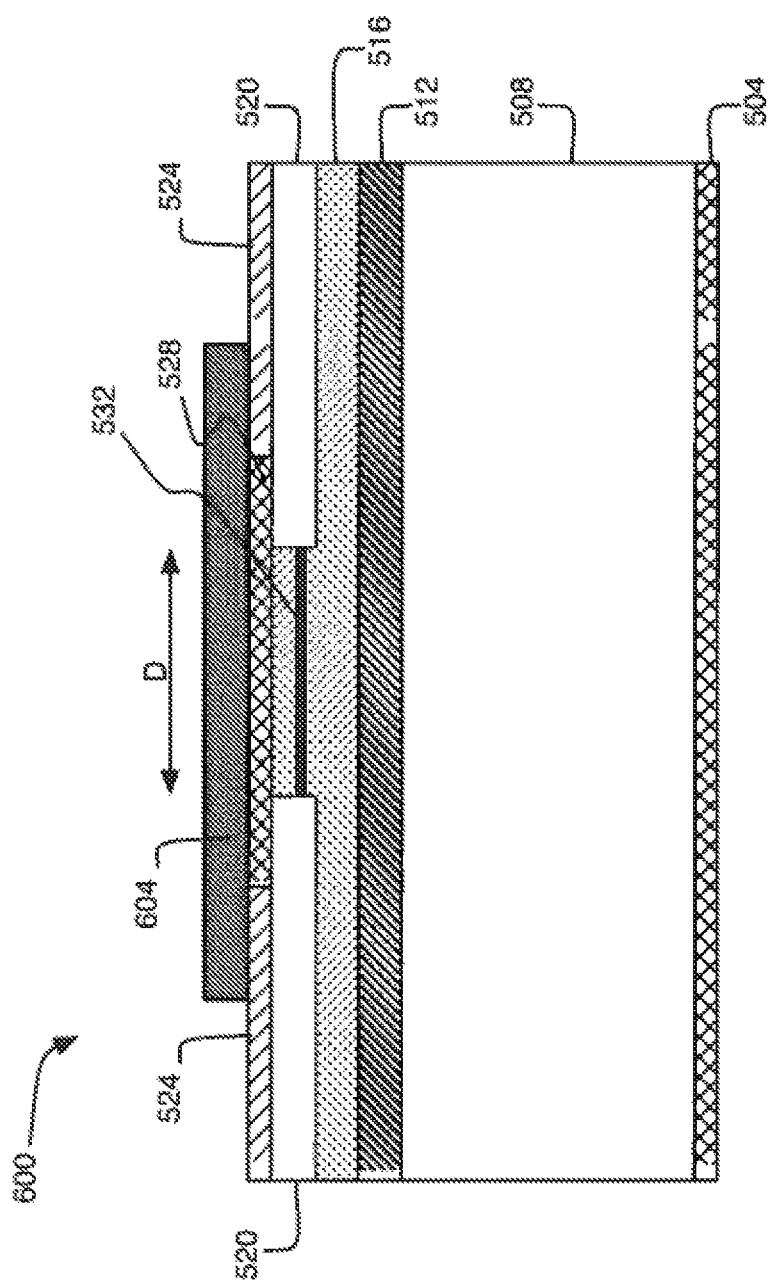
FIG. 6 is a cross-sectional view showing a second thin-film LED structure in accordance with embodiments of the present disclosure.

FIG. 6 depicts a second thin-film LED structure 600 having a controlled output power. Specifically, the thin-film LED structure 600 may be similar or identical to the thin-film LED structure 500 except that the thin-film LED structure 600 is provided with an attenuation layer 604 that substantially covers the active volume 532. As a non-limiting example, the attenuation layer 604 may be provided to reduce the output power of the LED structure 600. In some embodiments, the attenuation layer 604 may be established by evaporating or sputtering a layer of alumina on top of the active passivation layer, outside the bonding area and then oxidizing the alumina. The oxidized alumina is relatively stable and is a very efficient attenuator of light emitted from the active volume 532. In some embodiments, the thickness of the attenuation layer 604 may be controlled to control the output power level of the LED structure 600. Of course, different thicknesses of attenuation layers 604 may be selected depending upon the desired output power for the LED structure 600 and the application later on.

Advantageously, the attenuation layer 604 is constructed so as to directly contact the passivation layer 524 as well as the top contact 528. In other words, the overall area of the attenuation layer 604 may be larger than the active volume 532 since some light emitted by the active volume 532 may be initially emitted toward the mirror layer 512 and reflected back toward the attenuation layer 604 at an area larger than the active volume 532. As with the thickness of the attenuation layer 604, the area of the attenuation layer 604 may also be controlled to accommodate a desired output power for the LED structure 600.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A thin-film Light Emitting Diode (LED), comprising:
   a substrate;
   a first electrode formed on the substrate;
   a second electrode;
   an epitaxial layer positioned between the first electrode and the second electrode and configured such that an electrical potential applied between the first electrode and the second electrode cause a portion of the active volume to emit light of a predetermined wavelength, wherein the epitaxial layer is provided with a proton implantation that destroys a crystalline structure of the epitaxial layer in selected locations to create an active volume having an area smaller than a total area of the epitaxial layer; and
   a passivation layer positioned over the active volume and being configured to at least one of: reduce reflection at an LED-air interface and protect material of the epitaxial layer from an environment surrounding the thin-film LED.

2. The thin-film LED of claim 1, wherein the area of the active volume is constricted by the proton implantation thereby increasing a carrier density in the active volume.

3. The thin-film LED of claim 1, wherein the selected locations of the epitaxial layer having the proton implantation is substantially inhibited from conducting current.

4. The thin-film LED of claim 1, wherein the active volume enables the LED to transmit data at a rate greater than 1 Gigabit/sec.

5. The thin-film LED of claim 1, further comprising:
   an attenuation layer positioned over the active volume thereby decreasing an intensity of light emitted from the thin-film LED by absorbing at least some of the light emitted by the active volume.

6. The thin-film LED of claim 5, wherein the attenuation layer comprises oxidized alumina.

7. The thin-film LED of claim 5, wherein the attenuation layer comprises a thickness designed to accommodate power ratings of an optical data communication system.

8. The thin-film LED of claim 1, wherein the passivation layer reduces reflection at an LED-air interface.

9. The thin-film LED of claim 1, wherein the active volume comprises at least two and no more than seven Quantum Wells.

10. The thin-film LED of claim 1, wherein the active volume is configured to produce light with rise and fall times no greater than 5 ns.

11. The thin-film LED of claim 1, wherein a thickness of the proton implantation is less than a thickness of the epitaxial layer.

12. The thin-film LED of claim 1, wherein the predetermined wavelength is between approximately 400 nm and approximately 1400 nm.

13. A Light Emitting Diode (LED) for use in a high speed optical data transmission system, the LED comprising:
   a substrate;
   an anode established on the substrate as a thin film;
   a cathode established on the substrate as a thin film;
   an epitaxial layer established between the anode and cathode, the epitaxial layer comprising a proton implantation that decreases an active volume of the epitaxial layer from a first area to a second area;
   an attenuation layer established on at least part of the active volume; and
   a mirror layer established on the substrate, wherein the active volume is positioned between the mirror layer and the attenuation layer.

14. The LED of claim 13, wherein the proton implantation destroys a crystalline structure of the epitaxial layer.

15. The LED of claim 13, wherein the attenuation layer comprises oxidized alumina.

16. The LED of claim 13, wherein the substrate comprises at least one of sapphire, Silicon Carbide, Silicon, Gallium Arsenide, and Germanium, wherein the anode and cathode comprise conductive metal, and wherein the epitaxial layer comprises Gallium Nitride.

17. The LED of claim 13, wherein the mirror layer comprises at least one of gold, silver, and alumina.

18. An optical communications system, comprising:
   a transmitter including one or more thin-film Light Emitting Diodes, each of the one or more thin-film LEDs being configured to transmit data at a rate greater than or equal to approximately 1 Gigabit/sec, wherein each of the one or more thin-film LEDs comprise:
   a substrate;
   an anode established on the substrate;
   a cathode established on the substrate;
   an epitaxial layer established between the anode and cathode, the epitaxial layer comprising a proton implantation that constricts a light-emitting volume of the epitaxial layer to enable data transmission rates to be greater than or equal to approximately 1 Gigabit/sec;
   an attenuation layer established on at least part of the epitaxial layer; and
   a passivation layer positioned over the light-emitting volume.

19. The system of claim 18, wherein the passivation layer comprises at least one of a quarter wavelength thickness and an odd multiple thickness to minimize reflections of light at an LED-air interface.

* * * * *